United States Patent [19]
Kehl et al.

[11] Patent Number: 5,132,925
[45] Date of Patent: Jul. 21, 1992

[54] RADIX-16 DIVIDER USING OVERLAPPED QUOTIENT BIT SELECTION AND CONCURRENT QUOTIENT ROUNDING AND CORRECTION

[75] Inventors: Theodore H. Kehl, Seattle; David N. Cutler, Bellevue, both of Wash.

[73] Assignee: Digital Equipment Corporation, Maynard, Mass.

[21] Appl. No.: 602,721

[22] Filed: Oct. 24, 1990

Related U.S. Application Data

[62] Division of Ser. No. 233,378, Mar. 18, 1988, U.S. Pat. No. 5,023,827.

[51] Int. Cl.⁵ .............................................. G06F 7/52
[52] U.S. Cl. .................................... 364/764; 364/761; 364/744
[58] Field of Search ...................... 364/744, 761, 764

[56] References Cited

U.S. PATENT DOCUMENTS

| | | | |
|---|---|---|---|
| 3,970,993 | 7/1976 | Finnila | 364/200 |
| 4,320,464 | 3/1982 | Desmonds | 364/766 |
| 4,484,259 | 11/1984 | Palmer et al. | 364/754 |
| 4,503,512 | 3/1985 | Doran | 364/761 |
| 4,722,069 | 1/1988 | Ikeda | 364/767 |
| 4,724,529 | 2/1988 | Irukulla et al. | 364/761 |
| 4,758,972 | 7/1988 | Frazier | 364/745 |
| 4,758,974 | 7/1988 | Fields et al. | 364/748 |
| 4,760,550 | 7/1988 | Katzman et al. | 364/748 |
| 4,817,048 | 3/1989 | Rawlinson et al. | 364/761 |

OTHER PUBLICATIONS

Mifsud, "A multiplier Precision Division Algorithm", Comm. of the ACM, vol. 13, No. 11, Nov. 1970, pp. 666–668.
Saltman, "Reducing Computing Time for Synchronous Binary Division", IRE Trans. on Electronic Computers, Jun. 1961, pp. 169–174.
Tan, "High-Radix Division Quotient Selection by 2-Level Control Memories", IBM Tech. Discl. Bull., vol. 18, No. 3, Aug. 1975, pp. 837–839.
Tan, "Transform High-Radix Division for High Performance Computer", IBM Tech. Discl. Bull., No. 11B, Apr. 1982, pp. 5812–5819.
Tan, "High-Speed Decimal Division", IBM Tech. Discl. Bull., vol. 25, No. 1, Jun. 1982, pp. 77–83.
Atkins, "Higher Radix Division Using Estimates of the Divisor and Partial Remainders", (1968), IEEE Trans. on Comp., vol. C-17, No. 10, pp. 925–934.
Gosling, "Design of Arithmetic Units for Digital Computers", Chapter 5, (1980).
Taylor, "Radix 16 SRT Division with Overlapped Quotient Selection Stages", (1985), IEEE, pp. 64–71.

*Primary Examiner*—Tan V. Mai
*Attorney, Agent, or Firm*—Arnold, White & Durkee

[57] ABSTRACT

A radix-16 divider, generally including two improved radix-4 dividers cascaded combinatorially, also utilizes improved overlapping quotient bit selection, together with concurrent quotient bit selection and rounding techniques, to produce four bits of quotient per divider cycle with reduced hardware requirements.

2 Claims, 9 Drawing Sheets

|  | | | DIVISOR | | | | | | | |
|---|---|---|---|---|---|---|---|---|---|---|
|  | | | .1000x | .1001 | .1010 | .1011 | .1100 | .1101 | .1110 | .1111 |
|  | PR>1.5 | | -2 | -2 | -2 | -2 | -2 | -2 | -2 | -2 |
|  | 1.5 | 001.100 | -2 | -2 | -2 | -2 | -2 | -2 | -2 | -2 |
|  | 1.375 | 001.011 | -2 | -2 | -2 | -2 | -2 | -2 | -2 | -2 |
| PARTIAL | 1.25 | 001.010 | -2 | -2 | -2 | -2 | -2 | -2 | -1 | -1 |
| REMAINDER | 1.125 | 001.001 | -2 | -2 | -2 | -2 | -2 | -1 | -1 | -1 |
| (PR) | 1 | 001.000 | -2 | -2 | -2 | -2 | -1 | -1 | -1 | -1 |
|  | 0.875 | 000.111 | -2 | -2 | -1 | -1 | -1 | -1 | -1 | -1 |
|  | 0.75 | 000.110 | -2 | -1 | -1 | -1 | -1 | -1 | -1 | -1 |
|  | 0.625 | 000.101 | -1 | -1 | -1 | -1 | -1 | -1 | -1 | -1 |
|  | 0.5 | 000.100 | -1 | -1 | -1 | -1 | -1 | -1 | -1 | -1 |
|  | 0.375 | 000.011 | -1 | -1 | -1 | -1 | -1 | -1 | -1 | -1 |
|  | 0.25 | 000.010 | -1 | -1 | -1 | -1 | 0 | 0 | 0 | 0 |
|  | 0.125 | 000.001 | 0 | 0 | 0 | 0 | 0 | 0 | 0 | 0 |
|  | 0 | 000.000 | 0 | 0 | 0 | 0 | 0 | 0 | 0 | 0 |
|  | -0.125 | 111.111 | 0 | 0 | 0 | 0 | 0 | 0 | 0 | 0 |
|  | 0.25 | 111.110 | 0 | 0 | 0 | 0 | 0 | 0 | 0 | 0 |
|  | -0.375 | 111.101 | 1 | 1 | 0 | 0 | 0 | 0 | 0 | 0 |
|  | -0.5 | 111.100 | 1 | 1 | 1 | 1 | 0 | 0 | 0 | 0 |
|  | -0.625 | 111.011 | 1 | 1 | 1 | 1 | 1 | 1 | 1 | 1 |
|  | 0.75 | 111.010 | 1 | 1 | 1 | 1 | 1 | 1 | 1 | 1 |
|  | -0.875 | 111.001 | 2 1 | 1 | 1 | 1 | 1 | 1 | 1 | 1 |
|  | -1 | 111.000 | 2 | 2 | 1 | 1 | 1 | 1 | 1 | 1 |
|  | -1.125 | 110.111 | 2 | 2 | 2 | 1 | 1 | 1 | 1 | 1 |
|  | -1.25 | 110.110 | 2 | 2 | 2 | 2 | 1 | 1 | 1 | 1 |
|  | -1.375 | 110.101 | 2 | 2 | 2 | 2 | 2 | 2 | 1 | 1 |
|  | -1.5 | 110.100 | 2 | 2 | 2 | 2 | 2 | 2 | 2 | 2 |
|  | PR<-1.5 | | 2 | 2 | 2 | 2 | 2 | 2 | 2 | 2 |

DECIMAL BINARY

*Fig.3*

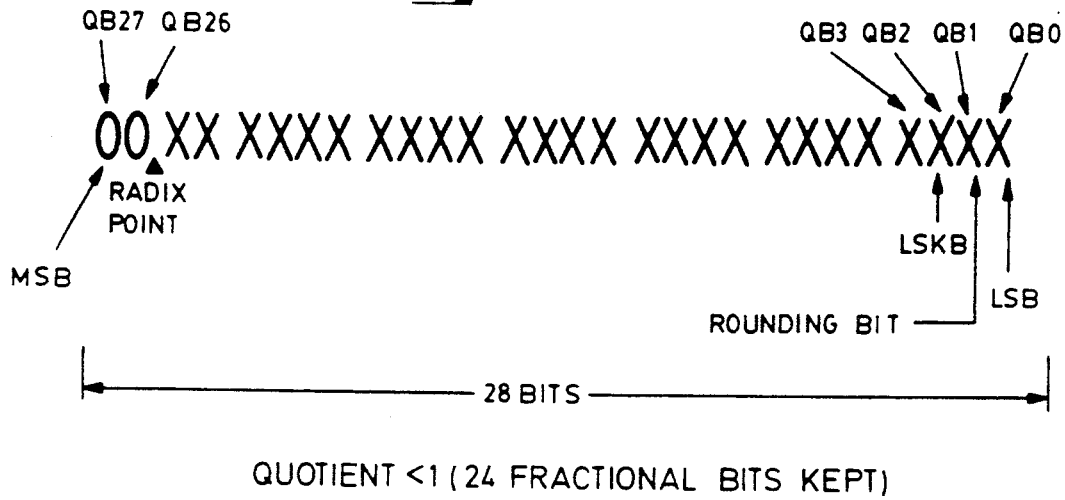
QUOTIENT <1 (24 FRACTIONAL BITS KEPT)
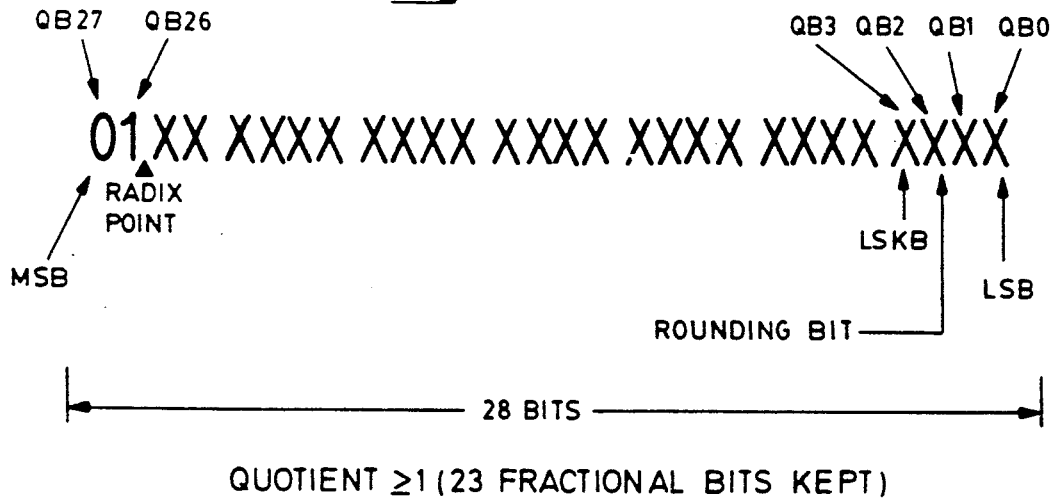
QUOTIENT ≥1 (23 FRACTIONAL BITS KEPT)

RADIX-16 DIVIDER USING OVERLAPPED QUOTIENT BIT SELECTION AND CONCURRENT QUOTIENT ROUNDING AND CORRECTION

This is a continuation of Ser. No. 233,378, filed Aug. 18, 1988, now U.S. Pat. No. 5,023,827, issued June 11, 1991.

BACKGROUND OF THE INVENTION

This invention relates to division of radix higher than 2, specifically to a radix-16 divider that makes use of overlapped quotient bit selection.

Hardware Division of Integers and Fractions

As those of ordinary skill are aware, programmable computers and similar arithmetic machines operate in the binary (base-2) numbering system, using only the digits 1 and 0 to express all numbers. (A digit in the binary system is referred to as a "bit," or binary digit.) These two digits can be stored electrically as a high voltage level and a low voltage level, respectively (or vice versa, as long as a consistent scheme is used). A pattern of high and low voltages can thus be treated, by an appropriately designed machine, as an expression of the bits of a number in the binary system.

Machine or "hardware" division using the binary system is conceptually similar to the schoolchild's long division in the decimal (base-10) system. Quotient digits are generated by repeatedly selecting digits that, multiplied by the divisor, can be subtracted from the corresponding digits either of the dividend or of the partial remainder (PR). This is illustrated below by the traditional representation, and below that an expanded representation, each in decimal notation, of a long division problem.

Traditional Representation:

```
        634
   4 | 2537
      -24
       13
      - 12
        17
      - 16
         1
```

Expanded Represenation:

```
        600 + 30 + 4 = 634
   4 | 2537
      -2400
        137
      - 120
         17
      -  16
          1
```

In the first step of the long division, the quotient digit 6 (representing 600) is selected as the largest 100's multiple of the divisor 4 that can be subtracted from the dividend 2537. In the second step, the quotient digit 3 (representing 30) is selected as the largest 10's multiple of the divisor 4 that can be subtracted from the PR 137. Finally, the quotient digit 4 is selected as the largest 1's multiple of the divisor 4 that can be subtracted from the PR17. No more subtraction can be performed, so the remainder is 1.

Hardware division of binary floating-point (i.e., non-integer) numbers is commonly accomplished by normalizing the divisor and dividend. An analogue to this may be found in commonly used scientific notation of decimal numbers. A number in scientific notation is represented as a number less than ten (known as a mantissa) multiplied by ten raised to a power (or exponent); for example, the number 55,000 would be normalized (expressed) as $5.5 \times 10^4$.

In binary division, the mantissa is ordinarily fractional, i.e., less than one, and the multiplier is two raised to a power. Normalization of a divisor and a dividend (i.e., the initial partial remainder) includes subtracting the exponent of the divisor from the exponent of the dividend; the result is the exponent of the quotient. The quotient's exponent is stored, and the division operation is performed only on the mantissas.

As a general proposition, the quotient digits and partial remainders generated in each cycle j are linked in the following recursive relationship:

$$p_{j+1} = rp_j - q_{j+1}d \quad (1)$$

where:
$j$ = the recursive index = 0, 1, . . . , m-1
$m$ = the number of digits, radix r, in the quotient
$d$ = the divisor
$r$ = the radix (e.g., radix-2 means base-2 or binary)
$p_j$ = the PR used in the jth cycle
$p_0$ = the original PR, i.e., the dividend
$p_m$ = the final PR, i.e., the remainder
$q_j$ = the jth quotient digit in which the quotient is of the form q0\$q1q2 . . . qm, the dollar sign indicating the radix point ("decimal point" in radix- or base-10 expression)

Expressed in words, equation (1) says that to obtain a PR $p_{j+1}$, the previous PR $p_j$ is multiplied by the radix r —i.e., it is shifted left by one digital position—to produce a number $rp_j$. The quotient digit selected for use in association with $p_{j+1}$, namely $q_{j+1}$, is then multiplied by the divisor d to produce a number $q_{j+1}d$, which is subtracted from the shifted PR, namely $rp_j$, to produce the new PR $p_{j+1}$. This equation and verbal description is taken from Atkins, "Higher-Radix Division Using Estimates of the Divisor and Partial Remainders," IEEE Transactions on Computers, Vol. C-17, No. 10, October 1968, at p. 925.

ALGORITHMS FOR HARDWARE DIVISION

The different steps (e.g., subtraction, addition, etc.) associated with hardware division for integers and fractions take a certain amount of time to be performed by real-life electronic components. The prior art is rich in methods designed to reduce this time and minimize the number of components required to do the actual work involved in division. A number of these methods (referred to in the art as "algorithms") are summarized in the book "Design of Arithmetic Units for Digital Computers," by John B. Gosling (New York: Springer-Verlag 1980).

The simplest method of hardware division in the binary system is known as the restoring algorithm. A divisor is subtracted from a dividend (each expressed in binary) and the sign of the result (the partial remainder or PR) is noted. If the sign of the PR is negative, the PR is restored to its former condition by adding the divisor back in, and a zero is used for the quotient bit. If the PR's sign is nonnegative, a one is used for the quotient bit. On average, $1.5 \times N$ (where N = the number of the bits in the quotient) addition-subtraction cycles are required to form the quotient.

NON-RESTORING ALGORITHMS

The simplest non-restoring algorithm uses the sign of the PR as follows:
1. If the sign is positive, use 1 as a quotient bit and subtract the divisor from the PR.
2. If the sign is negative, use 0 as a quotient bit and add the divisor to the PR.

In other words, the sign of the PR determines whether an addition or a subtraction of the divisor is done and whether the quotient bit is 1 or 0. The number of cycles required to form a quotient of N bits is now N.

SRT Variation On Non-Restoring Algorithm

The SRT (Sweeney-Robertson-Tocher) division algorithm improves the overall performance of the simple non-restoring algorithm described above. It does so not by reducing the number of cycles, but by reducing the amount of time needed to perform a cycle. It does this by eliminating one of the most important delay factors in the addition-subtraction cycle, namely the time required to "ripple the carry" from the least significant bit (LSB) of the PR to the most significant bit (MSB) and the sign.

The term "ripple the carry" is illustrated by the simple example of adding 1 to the decimal integer 9999. Adding the 1 to the rightmost digit 9 results in a 0 and "carry the 1." This carried 1, however, is added to the next 9 on the left, resulting in another 0 and carry the 1. This continues until the carry has been "rippled" to the leftmost 9 digit.

Each carry operation requires additional time to be performed by the machine's electronic components. The same ripple phenomenon is seen in subtraction when a "borrow the 1" must be rippled across a whole series of 0's in a number.

The carry-save addition approach reduces rippling of this type by storing carry digits (bits) until completion of the addition operation. An ordinary carry-save adder yields two vectors as output, a sum and a carry vector. This is known as a "redundant" form of representation of the sum, meaning that the sum depends not just on the sum bits but on the carry bits as well.

Carry-save addition is a fast method of addition. It is thus desirable to use carry-save addition in generating partial remainders in nonrestoring division. However, because the PR is kept in redundant form during carry-save addition, its sign cannot be easily determined.

Particularly when the PR is close to zero, the sign may be incorrectly determined as being negative meaning an addition may be performed when a subtraction was called for. It can be shown that the converse is never true —all subtractions are correct.

SRT division, as a variation of nonrestoring division, accounts for this uncertainty in using carry-save addition by introducing another option to adding or subtracting the divisor:
1. PR definitely positive: subtract the divisor from the PR.
2. PR too close to zero for rapid determination of the sign: do not perform any addition or subtraction.
3. PR definitely negative: add the divisor to the PR.

Since carry-save addition is often 4 times the speed of any non-redundant addition algorithm, the duration of a cycle can be reduced by four resulting in a four-fold increase in speed.

However, the "do nothing" state, introduced to allow the use of carry-save addition, can itself produce uncertainty. Consider the example of the last cycle being very slightly positive (meaning that a subtraction ideally should have been performed), but so close to zero that neither addition nor subtraction was performed.

In this circumstance, the quotient will be too low by 1 (in the LSB). This condition is called "slack." Slack can be thought of as a measure of uncertainty—at any given step the PR may be slightly incorrect but at the very end the exact quotient is obtained. SRT division has a slack of 1, indicating that one bit of the quotient is uncertain.

Slack is easily taken care of: if the final PR (i.e., the remainder, after all cycles have been performed) is negative, subtract 1 from the quotient and correct the remainder by adding the divisor to it.

SRT division accumulates the quotient bits in redundant form such that a subtraction produces a positive 1 in the positive quotient bits, an addition produces a $-1$ in the negative quotient bits and a "do nothing" produces a 0 in both. Adding the positive and negative quotients together produces an uncertain quotient that can be made exact by examining the sign of the final PR and performing the final restoring step if needed.

Higher-Radix Division

To this point the discussion has been restricted to methods producing 1 bit of quotient per cycle. These are called radix-2 methods. Higher-radix methods produce more than 1 quotient bit per cycle. Radix-4 division produces 2 quotient bits per cycle; radix-16 division produces 4 quotient bits per cycle.

Quotient Bit Selection

It has been shown that radix-16 quotient bits can be selected by the inspection of truncated versions of the divisor and of the partial remainder. Atkins describes some of the mathematical underpinnings of this approach in the above-cited paper.

Overlapped Quotient Bit Selection

It has been proposed that overlapping of the operation of quotient selection stages can lead to faster divider output speed. G. S. Taylor describes such an approach in "Radix 16 SRT Dividers with Overlapped Quotient Selection Stages," Technical Report, University of California at Berkeley Computer Science Division, 1985 (IEEE no. CH2146-9/85/0000/0064, DARPA contract no. N00034-KO251).

Quotient Correction

Quotient correction is preferably performed in division because the final partial remainder (FPR) in any division operation (binary, decimal, or other) should desirably fall within the following range:

$$0 < FPR < D \quad (2)$$

where D is the divisor.

If FPR falls outside of this range, the division is not complete. An example of this in ordinary decimal integer division would be dividing 127 by 4. One possible "final" integer result might be 127/4 = 30 (with remainder 7). This is technically a correct result, but it is not maximally precise, and maximum precision of the quotient is important when remainders are not saved (as is usually the case in machine arithmetic). For greatest precision, the quotient should be increased by one, and the remainder correspondingly decreased by D, to yield the result 127/4=31 (with remainder 3). Thus, 3 is the final (integer) partial remainder.

If the division were carried out to a precision of one decimal place, the final quotient would be 31.7 with remainder 0.2. If carried out to a precision of two decimal places, the final quotient would be 31.75 with a remainder of 0.

More generally, if FPR is greater than the divisor D, the quotient calculation has "undershot" the optimum result. For maximum precision, the quotient should be increased by a suitable integer (e.g., by one if FPR<2D) and FPR correspondingly decreased by the same integer multiple of the divisor D. If FPR is negative (as is routinely possible in non-restoring division algorithms), the quotient calculation has "overshot" the target. The quotient should then ba suitably decreased by an integer and the FPR increased by the same integer multiple of D.

Quotient Rounding

Quotient rounding may be performed when a division process produces more digits of quotient than will be used (i.e., the last few quotient digits are extra and will be "thrown away").

Consider the above decimal example of 127/5=31.75. Suppose that the fractional digits of the quotient (0.75) are generated, but are not used because an integer quotient is desired.

The fractional digits could simply be truncated to give an integer quotient of 31. However, this result would not be optimally precise, because the actual quotient 31.75 is closer to 32 than to 31.

The schoolchild's rounding method in this situation is to round up (i.e., add 1 to the least significant digit that is kept in the integer quotient) if the discarded digits 0.75 represent half or more of the distance between the lower integer value 31 and the higher integer value 32, i.e., if the discarded digits are one-half or greater.

Expressed another way, the schoolchild's method is this: add $\frac{1}{2}$ to the full (non-integer) quotient and truncate the result to an integer value. If the fractional part of the full quotient is $\frac{1}{2}$ or greater, the least significant kept bit (LSKB) will necessarily be incremented as a result of the addition; otherwise the LSKB will remain the same.

Quotient rounding in binary arithmetic is analogous: add 1 to the LSKB if the value of the lesser bits is one-half the LSKB or greater. (Here, the rightmost bit that will be used in the quotient output of the divider is referred to as the least significant kept bit.) In other words, if the bit immediately to the right of the bit designated as the LSKB is set (i.e., the discarded bits are at least $\frac{1}{2}$ LSKB), then the LSKB of the quotient is incremented by one.

One's and Two's Complement Notation

One's complement notation is a well-known way of representing binary numbers as positive and negative; to obtain the one's complement negative of a given number, simply invert the value of each bit. Most digital computers, however, operate in the equally well-known two's complement format. In the two's complement format, the negative of a number is obtained by inverting the value of each bit and then adding 1 to the result. It may be necessary at times to convert a result from one notation scheme into another notation scheme.

SUMMARY OF THE INVENTION

In accordance with the present invention, radix-16 division is accomplished through the iterative use of two radix-4 dividers connected combinatorially. Each of the two radix-4 dividers generates two quotient bits per iteration (cycle), so a total of four quotient bits is produced as a result of each such cycle.

A selection logic is implemented to determine the correct quotient bits to be produced in each radix-4 division operation, and to add the correct quotient-bit multiple of the divisor to the partial remainder to form the new partial remainder. The quotient bits for any radix-4 division operation are selected from among the numbers $-2$, $-1$, 0, $+1$, or $+2$. Therefore, where the divisor is D, the correct quotient-bit multiple for any radix-4 division operation will be one of $-2D$, $-D$, 0, $+D$, or $+2D$.

The two radix-4 dividers are arranged so that their respective selections of quotient bits are overlapped in time, in a novel implementation of the concept proposed by Taylor. The second of the two dividers calculates all possible choices of its selection logic output while the first divider is calculating the first two quotient bits; it selects one of those choices as soon as the first divider generates a new partial remainder. The second quotient-bit pair is in turn fed back as a control input to the multiplexer associated with the first divider. Thus, two pairs of quotient bits are determined approximately in parallel.

Considerable hardware savings are achieved by utilizing five bits of divisor and six bits of partial remainder to select quotient bits for the next partial remainder.

Quotient bits are generated in redundant form during each cycle; therefore, the redundancy of quotient bits must be removed before the required quotient rounding can occur. The addition of the negative quotient bits and the positive quotient bits is performed "on the fly," as each four-bit quotient group is generated, so that the complete quotient may be assimilated without waiting for a complete carry ripple. Additional time savings are thus achieved.

When a format having quotient bits not evenly divisible by four (e.g., the 26-bit quotient format of the VAX-F standard) is used, correction and rounding of the quotient may be achieved in a single step through the use of the spare bits generated by an integral number of cycles. This leads to still more time savings.

BRIEF DESCRIPTION OF THE DRAWINGS

FIG. 3 depicts a selection table of quotient bits.

FIGS. 8 and 9 illustrate the rounding process for the cases, respectively, in which the quotient is less than one, and in which the quotient is greater than or equal to one.

DETAILED DESCRIPTION OF SPECIFIC EMBODIMENTS

Basic Circuit

Figure 1:
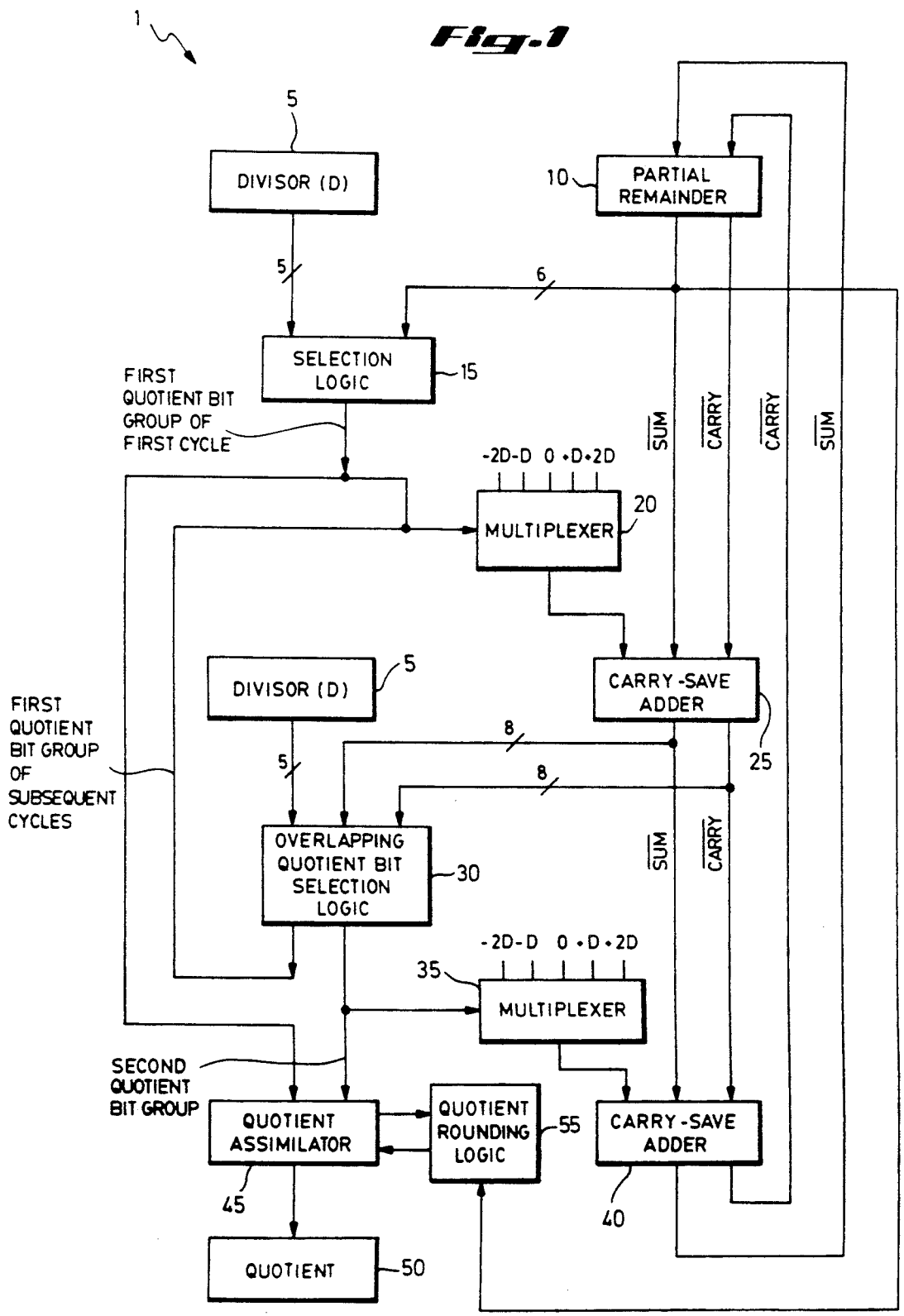
FIG. 1 is a block diagram of a radix-16 divider in accordance with the present invention.

A divider 1 in accordance with the invention is depicted in FIG. 1. In the divider 1, a register 5 is loaded with the divisor D. A register 10 is loaded with the initial partial remainder (PR) of the division, i.e., the dividend. The register 10 is a dual register for storing subsequent partial remainders in the redundant form of sum and carry outputs of a carry-save adder; the dividend, however, is loaded into the register 10 in irredundant (i.e., non-redundant) form (i.e., as a sum with the carry vector set to all zeros).

The five most significant bits of the divisor (register 5) are fed as inputs to a selection logic 15. Likewise, the six most significant bits of the partial remainder PR (register 10) are fed as inputs to the selection logic 15. It can be shown that it is sufficient to use only five and six bits of the divisor and partial remainder, respectively, in the selection process described below.

The selection logic 15 is an array of logic used to generate a pair of quotient bits as an output in response to the divisor and partial remainder inputs. The selection logic 15 is used only for the very first pair of quotient bits and is bypassed thereafter.

The output of the selection logic 15 is fed as a controlling input to a multiplexer 20 (e.g., a Booth multiplexer) that has five additional data inputs of $-2D$, $-1D$, 0, $+1D$, and $+2D$. The output of the multiplexer 20 is fed as an input to a carry-save adder 25.

The carry-save adder 25 receives input from the multiplexer 20 and from the partial remainder register 10. It adds these two inputs and generates a new partial remainder as its output. This output (sum and carry) is fed to an overlapped quotient bit selection logic 30, which receives as another input five bits from the divisor D (register 5). The overlapped quotient bit selection logic 30 generates a second pair of quotient bits, which serve as control inputs for a multiplexer 35 (e.g., a Booth multiplexer).

During any given cycle after the first one, the overlapped quotient bit selection logic 30 generates the first pair of quotient bits for the succeeding cycle, which bits are fed as control input to the multiplexer 20 in lieu of the output of the selection logic 15.

The multiplexer 35 has as data inputs $-2D$, 1D, 0, $+1D$, and $+2D$. The output of the multiplexer 35 is directed to a carry-save adder 40, which adds the outputs from the carry-save adder 25 (sum and carry) and the multiplexer output 35 to produce a new partial remainder for loading into the partial remainder register 10.

The output of the selection logic 15 is the first quotient bit pair to be produced on the first cycle. This pair is produced in redundant form, i.e., it consists of negative quotient bits and positive quotient bits. Similarly, the outputs of the overlapped quotient bit selection logic 30 comprise a second quotient bit pair also in redundant form, i.e., as negative and positive quotient bits. These negative and positive quotient bits are fed as inputs to a quotient assimilator 45.

The quotient assimilator 45 also receives input from quotient rounding logic 55. In turn, the quotient assimilator 45 delivers output to quotient rounding logic 55. Quotient rounding logic 55 also receives as input one bit from the partial remainder 10. The output of the quotient assimilator 45 is the quotient 50.

Shifting of Partial Remainders

As will be recognized by those of ordinary skill having the benefit of this disclosure, the division method discussed here entails a left shift in (i.e., multiplication by two of) the partial remainder after each addition operation, so that more bits of the dividend are brought into the partial remainder. In accordance with the present invention, a shift of two binary places (i.e., multiplication by four) occurs after each addition, since each of the radix-4 dividers employed divides 2 bits at a time.

Referring now to FIG. 1, this shift is accomplished by wiring the third through eighth most significant bits of the output of the carry-save adder 25 (representing the first new partial remainder generated in a cycle) to the six most significant bits of the input of the overlapped quotient bit selection logic 30 (as discussed in more detail below). This has the effect of "shifting" the output of the carry-save adder 25 leftward by two bits.

The full-width output of the carry-save adder 25 is wired in similar fashion to each of the inputs of the carry-save adder 40, whose output in turn is wired in the same manner to the input of the partial remainder register 10.

The Selection Table

The selection logic 15 is used to determine the appropriate multiple of the divisor D ($-2D$, $-D$, 0, $+D$, or $+2D$) to add to the current partial remainder (register 10) to form the new partial remainder (output of the carry save adder 25).

FIG. 3 specification for a quotient bits selection table, describes the inputs and possible outputs of the selection logic 15. The Figure details the quotient bits that are selected by the selection logic 15 depending on five bits of the divisor and six bits of the partial remainder. Those of ordinary skill having benefit of this disclosure will recognize that after the divisor is normalized as discussed earlier, the normalized mantissa of the divisor will always be between the values $\frac{1}{2}$ and 1 (i.e., it will be of the form 0.1xxxx . . . ). Thus the five bits used are the five bits immediately to the right of the radix point. The six most significant bits of the PR are used, as indicated in FIG. 3.

The row headings of FIG. 3 represent the possible values of the the partial remainder (to three fraction bits of accuracy). The column headings of FIG. 3 represent the possible values of the normalized divisor D (to four or, in two cases, five fraction bits of accuracy).

Consider as an example the divisor/partial remainder pair indicated by ruled lines in FIG. 3. The divisor D, to four fraction bits of accuracy, equals 0.1011; the partial remainder PR, to three fraction bits of accuracy, equals 000.101. As depicted in FIG. 3, when provided with these numerical inputs, the selection logic 15 selects $-1$, indicating that $-1$ times D should be added to the current PR to produce the new PR. FIG. 3 also details the correct choice for when the current partial remainder is outside the range of the numbers shown; for any value of the current PR greater than 1.5, $-2$ is the correct choice; similarly, for any value of the PR less than $-1.5$, $+2$ is correct.

Note that in one place on the Figure, two values are indicated for a given D and PR. This occurs for PR=111.001 and D=0.1000x. For this case, the "x" shown in the last bit place of the divisor indicates that the correct choice of divisor multiple requires examination of the fifth bit of the divisor. For example, in the case where (D,PR) equals (0.10000,111.001), the choice +2 is the correct one; for the case (0.10001,111.001), the choice +1 is correct.

One implementation of the selection logic 15 is discussed below in conjunction with the logically equivalent selection logics of the overlapping quotient bit selector logic 30.

Overlapping Quotient Bit Selection

Figure 2:
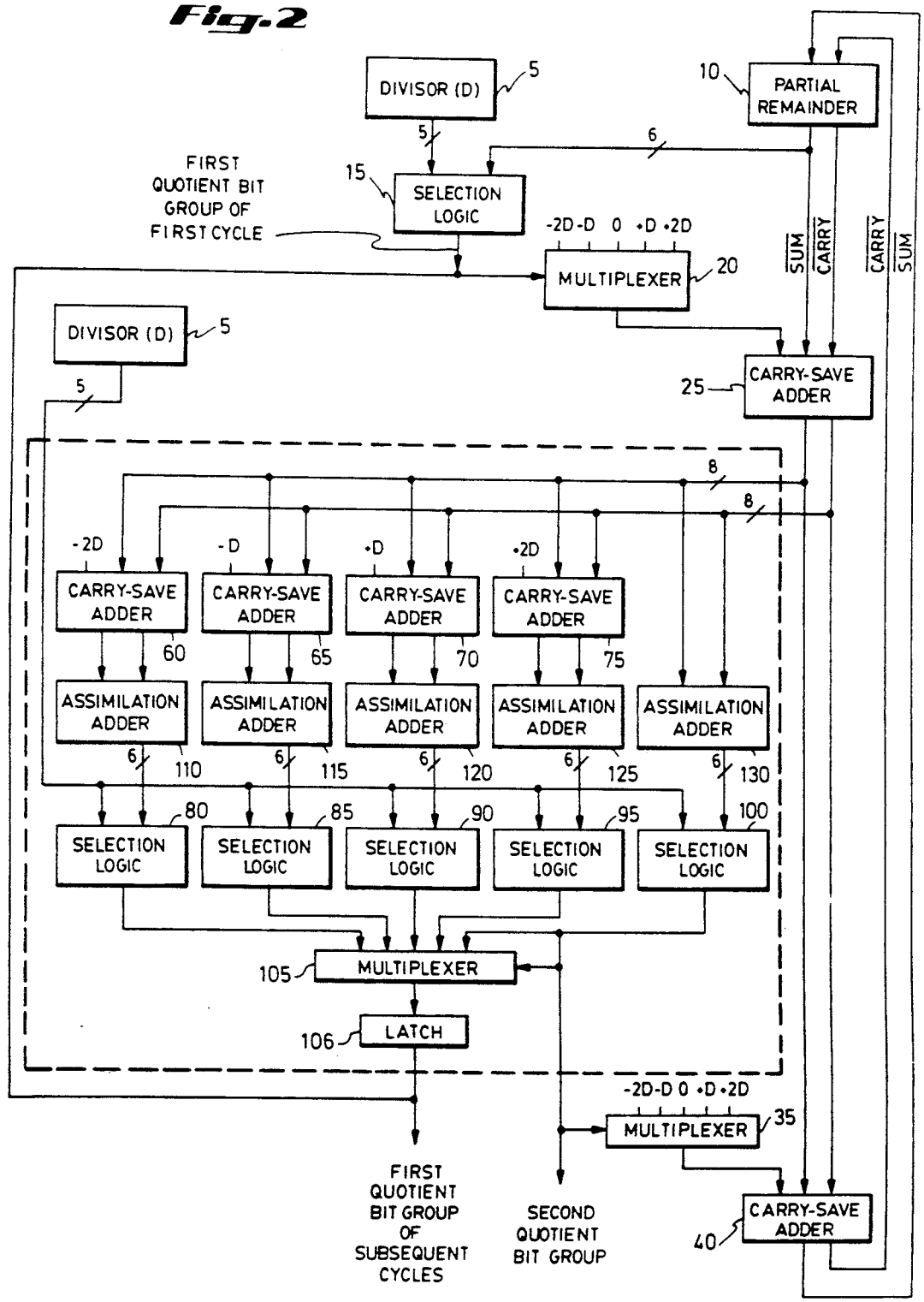
FIG. 2 depicts a portion of the divider of FIG. 1 in more detail.

Referring to FIG. 2, the overlapping quotient bit selection logic 30 multiplexes five individual selection logics in parallel. Thus, all possible cases of the second selection (corresponding respectively to $-2D$, $-1D$, $0$, $+1D$, and $+2D$) are performed for the second selection at the same time that the first selection is being performed.

The resultant partial remainder can then be used in selecting the next partial remainder with reduced delay. In effect, the first two quotient bits and the second two quotient bits are selected approximately simultaneously.

Only the leftmost eight bits of the output of the carry-save adder 25 (i.e., of the first partial remainder of the cycle in question) are fanned out as input to each of four carry-save adders 60, 65, 70, and 75. These adders perform the above-described simultaneous addition of $-2D$, $-D$, $+D$, and $+2D$, respectively, to this partial remainder, leaving to be dealt with only the case in which 0 is so added.

No carry-save adder is needed for the case in which 0 times the divisor is added to the first partial remainder of the cycle. Nonetheless, the redundant form in which this partial remainder is output (by the carry-save adder 25) requires conversion to irredundant form prior to being fed t the selection logic 100.

Accordingly, the output of the carry-save adder 25 is also fanned out as input to an assimilation adder 130, which may be a conventional carry-lookahead adder, as indicated in FIG. 2. For the same reason, the outputs of the carry-save adders 60, 65, 70, and 75 are fed respectively as inputs to assimilation adders 110, 115, 120, and 125, which may be of the same kind as the assimilation adder 130.

Each of these assimilation adders converts the output of its carry-save adder 25 to nonredundant form. The outputs of the assimilation adders are fed as inputs respectively to selection logics 80, 85, 90, 95, and 100. Each of these selection logics is logically equivalent to the first selection logic 15. The selection logic 80 computes the quotient bit selection for the case $-2D$; the selection logic 85 computes for the case $-1D$, and so on as indicated in FIG. 3. Note that the selection logic 100 computes the selection for the case in which 0 is added to the first partial remainder generated in any given cycle, i.e., to the output of the carry-save adder 25.

Figure 4:
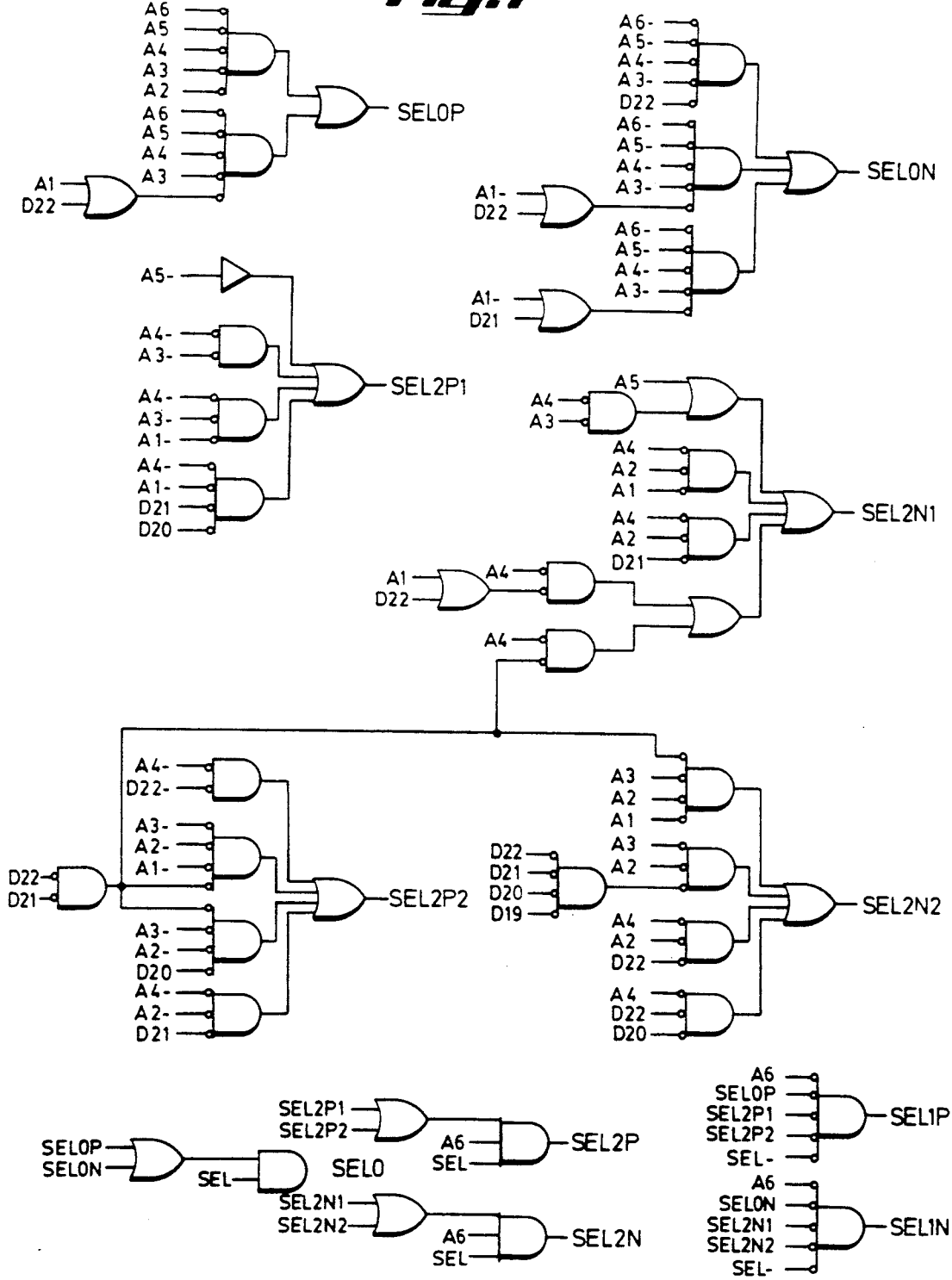
FIG. 4 is a schematic diagram of an implementation of the selection table.

One implementation of the selection logics 80, 85, 90, 95, and 100 is depicted in FIG. 4. The implementation shown uses inputs only from the second- through fifth-most significant bits of the divisor D; since the most significant bit is known always to be 1, the logic is designed accordingly. Many equivalent implementations of AND-OR and related logic may be utilized, as will be appreciated by those of ordinary skill having the benefit of this disclosure.

In FIG. 4, the signals produced by the illustrated selection logic may be traced. The inputs A6 through A1 are from the partial-remainder output on one of the assimilation adders 110, 115, 120, 125, and 130; A6 is most significant. (On the first cycle, A6 through A1 come from the dividend.) Inputs D22 through D19 are from the divisor. Intermediate results SEL0P (for $+0D$) and SEL0N (for $-0D$) enable output SEL0 which selects 0 times the divisor. Similarly, SEL2P1 and SEL2P2 both enable output SEL2P to select $+2$ times the divisor. Furthermore, SEL2N1 and SEL2N2 both assert the output SEL2N to select $-2$ times the divisor. If none of these signals are asserted true, then by mutual exclusion the sign of the carry-propagation adder determines whether to add $+D$ or $-D$: output SEL1N determines that $-D$ should be added, and output SEL1P determines that $+D$ should be added.

The outputs of the selection logics 80, 85, 90, 95, and 100 are fed as data inputs to a multiplexer 105. The selection logic 100 additionally produces the second pair of quotient bits in the cycle and provides control inputs for both the multiplexer 105 and the multiplexer 35.

The multiplexer 105 generates the first two quotient bits of the next cycle. These quotient bits are stored momentarily in latch 106 so that they may be input to the quotient assimilator 45 at the same time as the second pair of quotient bits for that cycle. In addition, the multiplexer 105 provides a control input for the multiplexer 20. This control input, on the second and subsequent cycles of the divider, takes the place of the output of the selection logic 15, which provided the control input on the first cycle.

Thus, the first two quotient bits of the first cycle are generated by the selection logic 15; the second two quotient bits of the first cycle are generated by the overlapping quotient bit selection logic 30, meaning effectively by the selection logic 100. On the second and subsequent cycles, the first two quotient bits are generated by the multiplexer 105 (and stored in the latch 106), and the second two bits are again generated by the selection logic 100.

Reduced Logi Requirements

It will be observed that only the eight most significant bits of the carry-save adder 25 are fed to the overlapping quotient bit selector logic 30. It will also be noted that the assimilation adders assimilate the eight-bit outputs of the carry-save adders 25, 60, 65, 70, and 75 to produce six bits as output.

As mentioned above, it can be shown that only five bits of divisor and six bits of partial remainder are needed to select the correct quotient bits from the selection logics 15, 80, 85, 90, 95, and 100. In other words, five and six bits of accuracy, respectively, are required to generate the next partial remainder.

Because of this, the size of the carry-save adders 60, 65, 70, and 75 can be reduced from a large number of bits (54 bits is common) to only eight bits wide, thus achieving significant hardware savings. By the same token, the assimilation adders 110, 115, 120, 125, and 130 may a of reduced size.

This reduction may allow the entire overlapping quotient bit selection logic 30 to be placed on a single integrated circuit, with the remaining logic of the radix-16 divider 1 to be placed on a second integrated circuit if necessary.

Figure 5:
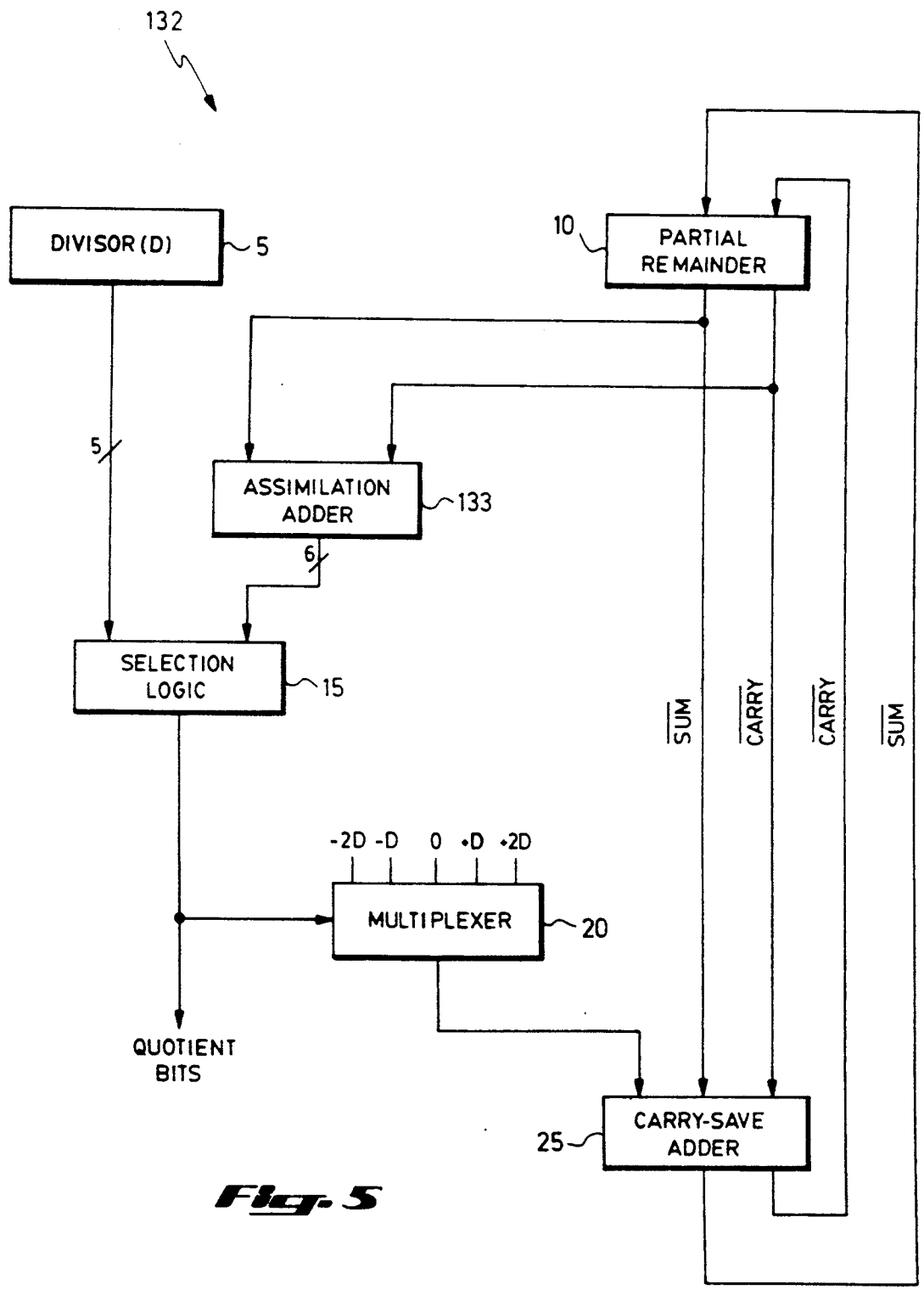
FIG. 5 depicts an improved radix-4 divider.

It will be recognized by those of ordinary skill having the benefit of this disclosure that the foregoing arrangement of components for selection of quotient bits in a radix-16 divider may be thought of as a cascading of two improved radix-4 dividers, each generally in a form such as divider 132 (shown in FIG. 5) to generate 4 quotient bits.

Concurrent Quotient Assimilation Making Use of Carry-Propagate and Carry-Stop Modes The quotient assimilator 45 advantageously performs "on-the-fly" assimilation, to irredundant form, of the quotient bits selected by the selection logic 15 and the overlapping quotient bit selection logic 30.

The quotient bit pairs produced by the divider 1 are in redundant form. In other words, if any given quotient bit pair is negative (as determined by the appropriate selection logic), the bits are stored in a negative quotient register; if the selected quotient bit pair is positive, it is stored in a positive quotient register.

Plainly, each of the negative and positive quotient registers represents only part of the quotient. The complete quotient (before rounding and correction) is conventionally arrived at by adding these two registers together at the end of the division process. (The use of negative and positive quotient registers in redundant division processes is well-known and is not illustrated in the Figures.)

In accordance with the invention, the quotient bits that are generated in each cycle of the divider 1 are assimilated "on the fly" to reduce the carry time and also reduce the complexity of the adder needed to ripple the carry. As a group of quotient bits is generated, the negative and positive quotient registers are added together to generate a sum bit group and a carry-out.

Conventional logic is used to detect a pending "carry-propagate" condition, i.e., if the sum bit group comprises all ones. Such a sum bit group is referred to as being in "carry-propagate mode." If a sum bit group is not in carry-propagate mode (i.e., if any bit in the group is a zero), it is referred to as being as in "carry-stop mode."

If a sum bit group is in carry-propagate mode, a carry-in to that group will propagate through the group to the next more significant group. On the other hand, a carry-in to a group in carry-stop mode will not propagate.

For example, if a group of four bits consists of 1111, then adding 1 (as a carry-in) to the LSB of this group will generate 1 0000 (all zeros plus 1 as a carryout). If a group of four bits is 1011, adding a 1 will generate 1100 and no carry-out.

The final value of any Jth group of quotient bits, formed by any Jth cycle, may be determined with exactness after it has been determined whether a carry will ripple into that group from the (J+1)th group (i.e., the next less significant group). A carry will not propagate into the Jth group if the bits of the (J+1)th group include one or more zeros, even if a carry-in is input into the (J+1)th group from the (J+2)th group. On the other hand, if the bits of the (J+1)th group comprise all ones, not enough information is available to determine whether whether a carry-in to the Jth group might occur.

An example may be used to illustrate this point. On the first cycle, the first quotient bits are generated in redundant form. In other words, a set of four first negative quotient bits and a separate set of four first positive quotient bits are generated. These two first sets of four bits each are added together and any carry out is thrown away, in the conventional manner for two's complement arithmetic.

On the second cycle, the second set of four negative and positive quotient bits are generated and added together in the same manner. Any carry-out from the second group is then added to the first group as a carry-in.

At this point, if the second group does not comprise all ones, it is therefore known that the first group is exact (because any carry-in to the second group will not propagate through to the first group). On the other hand, if the second group does comprise all ones, any subsequent carry-in to the second group from the third group will ripple through into the first group. If the third group also comprises all ones, then the first group is still inexact, because any carry into the third group will ripple through both the third and the second groups and into the first group.

Indeed, as long as subsequent groups of four quotient bits are all ones, the first group will remain inexact. In the worst case, the exact value of the first group is not known until the last cycle is completed because all the intervening cycles have produced all ones.

According to the conventional method of quotient assimilation such a carry ripple would be quite time consuming as it would pass through the entire quotient assimilation adder from the least significant bit to the most significant bit. By contrast, according to the present invention, exactness of higher order groups of four is determined when a lower order group of four arrives in carry-stop mode.

The carry-out of each newly arrived group determines, exactly, all of the outstanding inexact groups. If this carry-out is one, then all inexact groups must be incremented by one to make them exact; if this carry-out is zero, the inexact groups are left alone and become exact as-is.

A feature of this invention is that inexactness of groups of four is kept with the groups and the increment, if needed, ripples across at most a group of four bits. Furthermore, the exactness of the first group of four (i.e., the group determining whether the quotient is less than one, or greater than or equal to one) is determined with reduced hardware and time.

Figure 6:
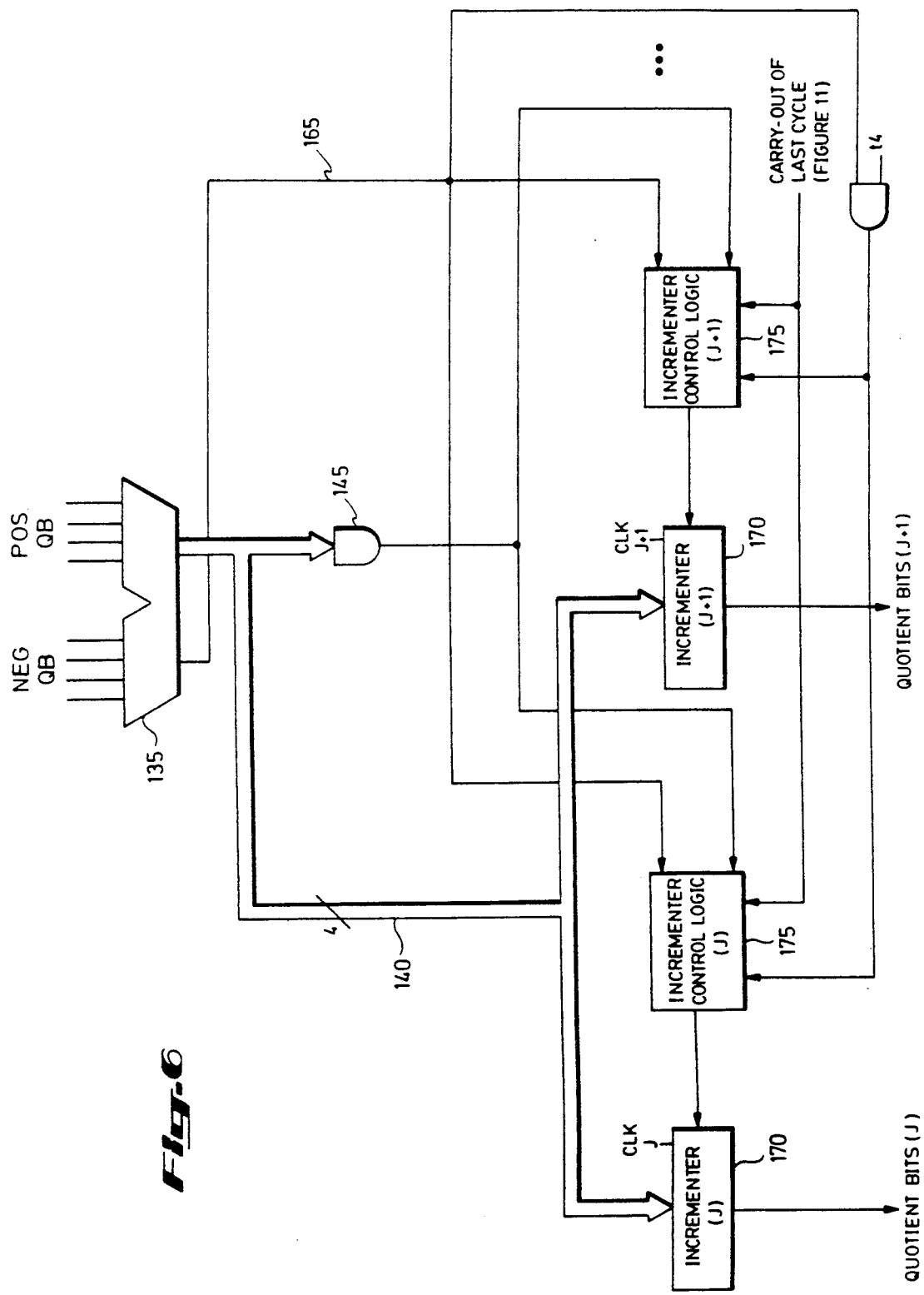
FIG. 6 is an implementation of the quotient assimilator depicted in block-diagram form in FIG. 1.

FIG. 6 depicts a quotient assimilation adder in accordance with this aspect of the invention.

A sum bit group of four quotient bits 140 is generated by an adder 135 which adds these negative and positive quotient bits together. These four quotient bits are fed as inputs to carry propagation detection logic 145 (shown as implemented with an AND gate) for determining carry propagation and generating a carry-propagate signal. The addition of positive and negative quotient bits by the adder 135 results in a carry-out signal 165.

The group of four quotient bits 140 is fed to each of a plurality of incrementers 170 via a signal router. The signal router delivers to each Jth incrementer 170 only the quotient bits associated with the Jth cycle. This may be accomplished, e.g., by clocking a bus only on the Jth cycle in a manner well-known to those of ordinary skill and therefore not shown.

Each of a plurality of incrementer control logics 175 is fed with the carry-propagate signal 145 and the carry-out signal 165. For purposes of explanation, the particular incrementer control logic 175 designated as the Jth such logic in FIG. 6 is the one that delivers a carry-in to the Jth incrementer 170.

Each four-bit incrementer 170 thus has four quotient bits as input, and a carry-in signal from its corresponding incrementer control logic 175 (shown immediately to the right in FIG. 6).

The operation of the Jth incrementer control logics 175 will now be explained. Each such logic will cause a carry-in to its corresponding Jth incrementer 170 if either of the following cases is true:

1) Generation of the (J+1)th group of quotient bits results in a carry-out ; or
2) Generation of the (J+1)th group of quotient bits results in four ones (i.e., the (J+1)th group goes to carry propagate mode) and a carry-in to the (J+1)th group of quotient bits is subsequently generated (i.e., a carry out is generated from the (J+2)th or any subsequent group of quotient bits).

Figure 7:
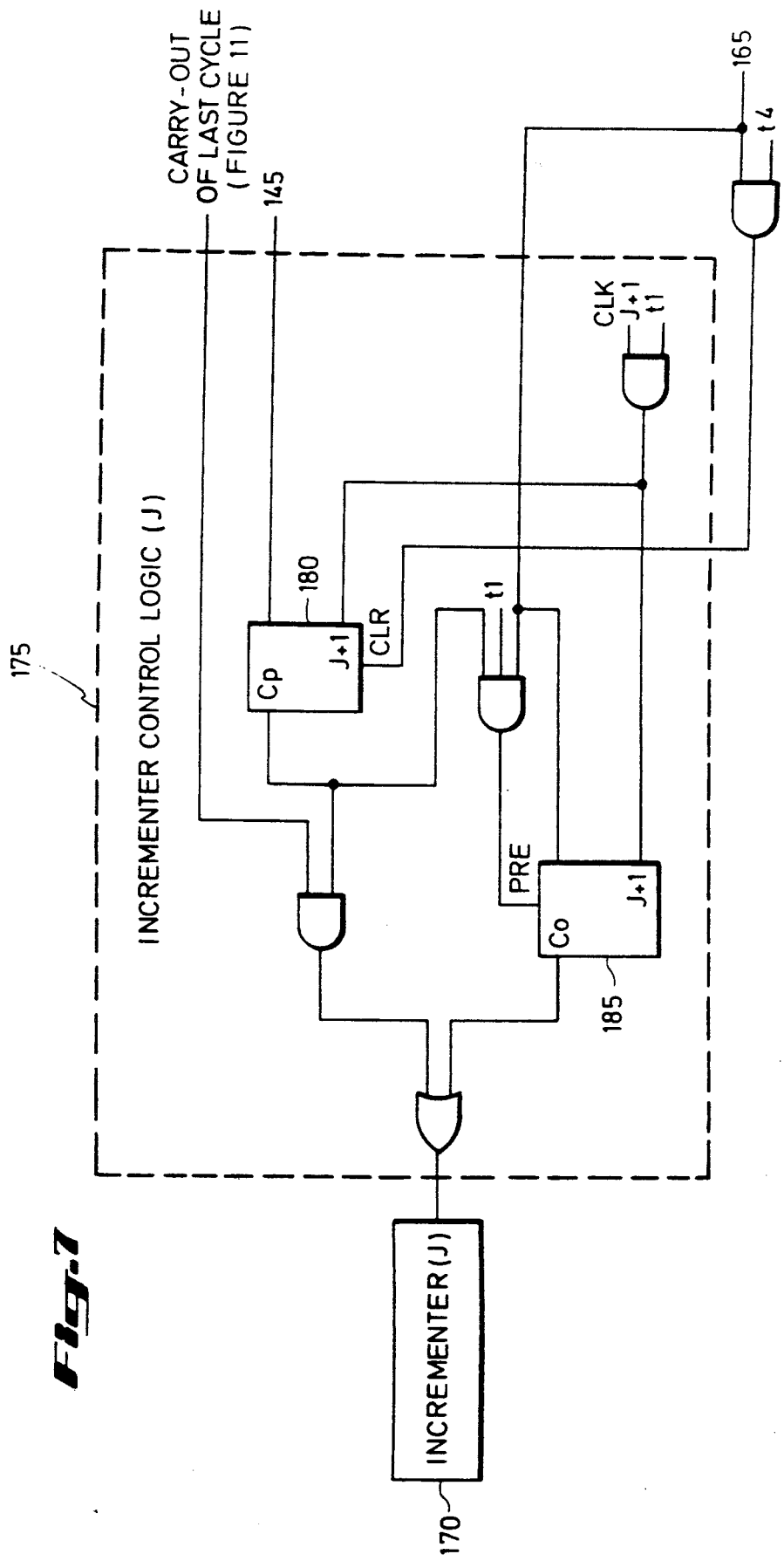
FIG. 7 illustrates a portion of the quotient assimilators of FIG. 6 in more detail.

Each Jth incrementer control logic 175 stores in latches (described below) the values of the carry-propagate and carry-out signals 145 and 165 of the (J+1)th four-bit group, and also receives as input the carry-out 165 of each four-bit group. FIG. 7 gives a more detailed representation of one of the incrementer control logics 175 used in the quotient as imilator 45.

The incrementer control logic 175 may be implemented using common logic circuitry which is well-known to one of ordinary skill. The carry-propagate and carry-out signals 145 and 165 of the (J+1)th four-bit group may be routed to the Jth incrementer control logics 175 through a signal router such as described earlier, e.g., by appropriate clocking of a bus.

Each incrementer control logic 175 includes a first latch 180 for storing the signal from carry-propagate logic 145. The latch 180 in the Jth incrementer control logic 175 is set if the four bits on the (J+1)th cycle comprise all ones; it is clocked by a system clock (shown in the Figures as t); and it is cleared if and when the carry-out of any subsequent cycle is set. This clearing mechanism is shown in FIGS. 6 and 7 as the logical AND of the carry-out 165 and a signal marked t4, which is to indicate that the clocking mechanism should cause this signal to be asserted on a later phase of the system clock cycle, to provide sufficient delay that the latch 180 will not be cleared too soon.

Each Jth incrementer control logic 175 also includes a second latch 185 for storage of carry-out information relating to the Jth group of four quotient bits 140. The latch 185 in the Jth incrementer control logic 175 is set if either (a) the (J+1)th cycle generates a carry-out or (b) if the (J+1)th cycle is in carry-propagate mode and a (J+n)th cycle, n>1, generates a carry-out. The latch 185 is also clocked by a system clock (shown as t1 in FIG. 7).

A signal representing the carry-out of the last cycle is also fed as an input to each Jth incrementer control logic 175. This takes into account the worst case, namely the one in which the (J+1)th cycle and all subsequent cycles are in carry-propagate mode, and finally the very last cycle generates a carry out. In such a case, the carry out from the very last cycle must ripple all the way up to the (J+1)th group—meaning that the (J+1)th group and all subsequent groups are not finally determined until the last cycle.

The carry-out signal from the last cycle is therefore fed to each Jth incrementer control logic 175, there to be ANDed with the latched carry-propagate signal 180 from the (J+1)th group. If this latch is still set by the time a carry-out of 1 is generated from the last cycle (i.e., if the (J+1)th group is still in carry-propagate mode), it follows that all groups between the last group and the (J+1)th group are still in carry-propagate mode, and the carry generated by the last group will ripple all the way to the Jth group. The Jth incrementer control logic 175 therefore gates the Jth incrementer 170.

It will be recognized by those of ordinary skill having the benefit of this disclosure that the signal router may equivalently be implemented through the use of demultiplexers to route the four-quotient-bit signals 140, the carry-propagate signals 145, and the carry-out signals 165, to the correct incrementers 170 and incrementer control logics 175.

Concurrent Quotient Rounding and Correction

In accordance with the invention, quotient rounding and correction are performed approximately concurrently. This requires determination of where in the quotient to add 1 for quotient rounding.

The proper bit to be incremented for quotient rounding is not necessarily constant from quotient to quotient. In many systems for machine division, floating point quotients are represented in a binary format that has a precision of a certain number of places or bits. For example, a common format includes a 24-bit precision—only the most significant 24 bits of a quotient mantissa are kept.

In such a format, the number of fractional bits in the mantissa—and therefore the location of the proper bit to be incremented for rounding of a quotient in such a format—necessarily depends on the value of the mantissa. If the mantissa is less than 1, then of course all 24 kept bits are fractional (i.e., no bits are kept above the radix point). On the other hand, if the mantissa is 1 or greater (but by definition is less than 2), then only 23 kept bits of the mantissa are fractional.

As shown in FIG. 8, if the mantissa of a quotient in such a format is less than than 1, the least significant kept bit (LSKB) of the quotient is the 24th fractional bit QB2. Rounding is thus performed by adding ½ LSKB to the quotient mantissa, i.e., by adding 1 to QB1, which is the 25th fractional bit and the rounding bit. As shown in FIG. 9, if the quotient is greater than or equal to 1, the rounding bit is the 24th fractional bit QB2.

(For convenience herein, the mantissa of a quotient is hereafter referred to simply as the quotient.)

Figure 10:
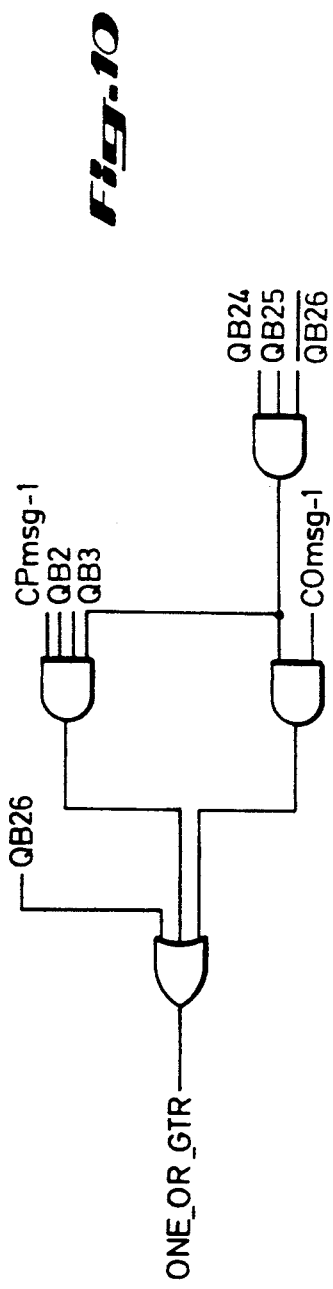
FIGS. 10 and 11 depict an implementation of the quotient correction and rounding scheme used.
Figure 11:
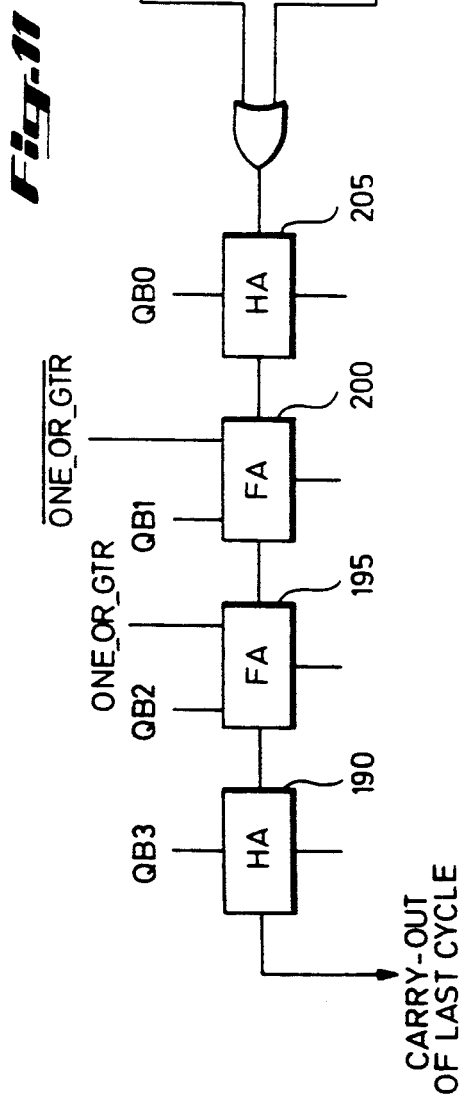

FIGS. 10 and 11 illustrate logic which may be used to determine correct quotient rounding and correction. FIG. 10 shows circuitry to determine whether the quotient is 1 or greater. If bit QB26 is 1, then plainly the quotient value is one or greater, and so the rounding bit is therefore QB2 as explained above.

This analysis is not necessarily sufficient, however. It is necessary to determine accurately whether the effects of rounding and/or correction will themselves cause the quotient to become greater than one, in order to ensure that the rounding bit is not improperly added at the wrong place. In accordance with the present invention, this determination may be made as shown in FIG. 10.

The quotient will ripple upward to become greater than one if (a) it is not already one or greater (i.e., QB26 is not set), and (b) QB25 is set, and (c) QB24 is set, and (d) either of the following two cases is true:

(1) the most significant group (MSG) is exact (i.e., $CP_{msg-1}$ is 0) and its carry-in ($CO_{msg-1}$) is one; or
(2) the most significant group is inexact (i.e., $CP_{msg-1}$ is 1) and the two most significant bits of the final group of 4 (QB2 and QB3) are set.

In case 1, by hypothesis QB26 is 0, and both lesser significant bits of the most significant group are 1; a carry-in to the group is postulated, resulting in QB26 becoming 1.

In case 2, again QB26=0 and both lesser significant bits of the most significant group are 1. Because this group is inexact (and therefore all lesser significant bits down to the last two are in carry-propagate mode), an increment will ripple all the way up and change QB26 to a one. It is thus known that at least one ripple will definitely occur, since the quotient is in one's complement form and converting to two's complement form (by adding 1) causes a ripple. Thus QB26 will definitely change to 1.

Conventional quotient assimilators require a much longer ripple time because the ripple would be through all the bits of the quotient assimilator from the least significant to the most significant. It is not necessary actually to perform the ripple, however, but simply to provide the same result as if the ripple had taken place.

In accordance with the invention, the existence of conditions causing the quotient to be one or greater are detected and the rounding and correction are done simultaneously. Thus, the slow conventional method of rippling the quotient from the least significant bit to the most significant bit is avoided, by providing a quotient assimilator that is greatly reduced in circuitry to achieve the same results in a much shorter time.

This may be implemented in logic such as that depicted in FIG. 10; the result may be used as is shown in FIG. 11 to add the rounding bit in the appropriate place.

FIG. 11 shows circuitry for incrementing the correct rounding bit and for performing quotient correction. The designations "HA" and "FA" shown in the Figure refer respectively to a half-adder or incrementer (which has one input plus a carry-in and carry-out) and a full adder (which has two inputs plus a carry-in and carry-out).

In FIG. 11, the symbol SIGN_FPR designates the sign of the final partial remainder, which is readily obtained from the partial remainder register 10. The term FINAL QBIT=2 stands for the case in which the final quotient bit pair generated by the divider is equal to 10, i.e., 2.

The carry-out of an incrementer 190 (i.e., the carry-out of the group of 4 bits generated by the divider 1) is input to the rest of the quotient assimilator as is illustrated in FIGS. 6 and 7.

It will be noted that the particular variation on the non-restoring division method used yields slack in the quotient, which was discussed earlier. This minute uncertainty in the quotient must be accounted for before the division operation is to be complete. In accordance with this invention, slack is accounted for through concurrent performance of quotient correction and quotient rounding.

A one's-complement conversion must eventually be performed, because addition of the negative and positive quotient bits as shown in FIG. 6 yields a sum 140 and carry-out 165 which are correct values in the one's complement format. It is therefore ordinarily desirable to convert the value of the final quotient back to two's complement.

Such one's-complement conversion can be taken into account during quotient correction. Quotient correction according to the division method used calls for either −1, 0 or +1 to be added to the final quotient. When conversion into two's complement is taken into account, this correction takes the following form:

1) if the quotient is one or greater and the partial remainder is positive, then add 2 to the least significant bit of the quotient;
2) if the quotient is less than one, and the last quotient bit pair is two, and the FPR is negative, then add 1 to the LSB; or
3) if the quotient is less than one, and either the last quotient bit pair is not two, or the FPR is not negative, then do nothing.

The logic depicted in FIG. 11 implements this correction scheme.

While this disclosure describes a specific embodiment of this invention, it will be recognized that other embodiments are possible. For example, those of ordinary skill having the benefit of this disclosure will of course recognize that the hardware-based discrete logic functions herein may alternatively and equivalently be implemented in software, i.e., through suitable programming of a processor system equipped with a suitable processor and a memory or other storage device. Such a software implementation would be a matter of routine for those of ordinary skill having the benefit of this disclosure and knowledge of the processor system in question. This disclosure is only intended as means of illustration and explanation. Those skilled in the art will recognize that this invention may be implemented for other applications. It is therefore noted that various modifications and changes may be made without departing from the claims or the spirit of the invention.

What is claimed is:

1. A divider, operating in a first cycle and one or more subsequent cycles, for dividing a dividend by a divisor D, said divider comprising:

(a) a multi-bit register in which is loaded the divisor D;
(b) a multi-bit partial remainder register in which is initially loaded the dividend, said partial remainder register (1) having an input in a sum-and-carry form from a second-stage carry-save adder and (2) having a sum output and a carry output;
(c) first-stage selection logic (1) having as inputs (i) the five most significant bits of the divisor register and (ii) the six most significant bits of the partial remainder register, and (2) having an output of two first-pair quotient bits, said two first-pair quotient bits defining one of the numbers −2, −1, 0, +1, and +2, the number so defined being determined by a relationship among said inputs specified as follows, said relationship referred to as a FIG. 3 relationship;

DIVISOR

| | | 1000x | .1001 | .1010 | .1011 | .1100 | .1101 | .1110 | .1111 |
|---|---|---|---|---|---|---|---|---|---|
| PR>1.5 | | -2 | -2 | -2 | -2 | -2 | -2 | -2 | -2 |
| 1.5 | 001.100 | -2 | -2 | -2 | -2 | -2 | -2 | -2 | -2 |
| 1.375 | 001.011 | -2 | -2 | -2 | -2 | -2 | -2 | -2 | -2 |

-continued

| PARTIAL REMAINDER (PR) | | | | | | | | | | |
|---|---|---|---|---|---|---|---|---|---|---|
| 1.25 | 001.010 | -2 | -2 | -2 | -2 | -2 | -2 | -1 | -1 |
| 1.125 | 001.001 | -2 | -2 | -2 | -2 | -2 | -1 | -1 | -1 |
| 1 | 001.000 | -2 | -2 | -2 | -2 | -1 | -1 | -1 | -1 |
| 0.875 | 000.111 | -2 | -2 | -1 | -1 | -1 | -1 | -1 | -1 |
| 0.75 | 000.110 | -2 | -1 | -1 | -1 | -1 | -1 | -1 | -1 |
| 0.625 | 000.101 | -1 | -1 | -1 | -1 | -1 | -1 | -1 | -1 |
| 0.5 | 000.100 | -1 | -1 | -1 | -1 | -1 | -1 | -1 | -1 |
| 0.375 | 000.011 | -1 | -1 | -1 | -1 | -1 | -1 | -1 | -1 |
| 0.25 | 000.010 | -1 | -1 | -1 | -1 | 0 | 0 | 0 | 0 |
| 0.125 | 000.001 | 0 | 0 | 0 | 0 | 0 | 0 | 0 | 0 |
| 0 | 000.000 | 0 | 0 | 0 | 0 | 0 | 0 | 0 | 0 |
| -0.125 | 111.111 | 0 | 0 | 0 | 0 | 0 | 0 | 0 | 0 |
| -0.25 | 111.110 | 0 | 0 | 0 | 0 | 0 | 0 | 0 | 0 |
| -0.375 | 111.101 | 1 | 1 | 0 | 0 | 0 | 0 | 0 | 0 |
| -0.5 | 111.100 | 1 | 1 | 1 | 1 | 0 | 0 | 0 | 0 |
| -0.625 | 111.011 | 1 | 1 | 1 | 1 | 1 | 1 | 1 | 1 |
| -0.75 | 111.010 | 1 | 1 | 1 | 1 | 1 | 1 | 1 | 1 |
| -0.875 | 111.001 | 2 1 | 1 | 1 | 1 | 1 | 1 | 1 | 1 |
| -1 | 111.000 | 2 | 2 | 1 | 1 | 1 | 1 | 1 | 1 |
| -1.125 | 110.111 | 2 | 2 | 2 | 1 | 1 | 1 | 1 | 1 |
| -1.25 | 110.110 | 2 | 2 | 2 | 2 | 1 | 1 | 1 | 1 |
| -1.375 | 110.101 | 2 | 2 | 2 | 2 | 2 | 2 | 1 | 1 |
| -1.5 | 110.100 | 2 | 2 | 2 | 2 | 2 | 2 | 2 | 2 |
| PR<-1.5 | | 2 | 2 | 2 | 2 | 2 | 2 | 2 | 2 |

DECIMAL BINARY (d) a first-stage multiplexer (1) having as first stage data inputs the divisor D multiplied respectively by −2, −1, 0, +1, and 2,(2) having as a first-stage control input on said first cycle the output of said first selection logic, (3) having as a first-stage control input on said subsequent cycles the output of said overlapping quotient bit selector logic, and (4) having as an output the said first-stage data input whose value is equal to the number defined by the control input multiplied by the divisor D;

(e) a first-stage carry-save adder (1) having as inputs (i) the sum output and the carry output of the partial remainder register and (ii) the output of the first multiplexer, and (2) having as an output a first-stage partial remainder in said sum-and-carry form;

(f) said overlapping quotient bit selector logic (1) having as inputs (i) the five most significant bits of the divisor register and (ii) the eight most significant bits of the output of the first-stage carry-save adder, and (2) having as an output two second-pair quotient bits, said two second-pair quotient bits defining one of the number −2, −1, 0, +1, and +2, the number so defined being determined by a FIG. 3 relationship;

(g) a second-stage multiplexer (1) having a second-stage data inputs the divisor D multiplied respectively by −2, −1, 0, +1, and +2, (2) having as a second-stage control input the output of said overlapping quotient bit selector logic, and (3) having as a second-stage output the said second-stage data input whose value is equal to the number defined by the second-stage control input multiplied by the divisor D;

(h) said second-stage carry-save adder (1) having as inputs the output of said first-stage carry-save adder and the output of said second multiplexer, and (2) having a sum output and a carry output that together comprise a second-stage partial remainder; and (i) a quotient assimilation adder (1) having as inputs (i) on said first cycle, the output of said first-stage selection logic, and (ii) on said subsequent cycles, the output of said overlapping quotient bit selector logic, and (2) having as an output a four-bit quotient group.

2. A divider, operating in a first cycle and one or more subsequent cycles, for dividing a dividend by a divisor D, said divider comprising:

(a) a multi-bit divisor register in which is loaded the divisor D;

(b) a multi-bit partial remainder register in which is initially loaded the dividend, said partial remainder register (1) having an input in a sum-and-carry form from a second-stage carry-save adder and (2) having a sum output and a carry output;

(c) first-stage selection logic (1) having as inputs (i) the five most significant bits of the divisor register and (ii) the six most significant bits of the partial remainder register, and (2) having an output of two first-pair quotient bits, said two first-pair quotient bits defining one of the numbers −2, −1, 0, +1, and +2, the number so defined being determined by a relationship among said inputs specified as follows, said relationship referred to as a FIG. 3 relationship;

DIVISOR

| PARTIAL REMAINDER (PR) | Decimal | Binary | .1000x | .1001 | .1010 | .1011 | .1100 | .1101 | .1110 | .1111 |
|---|---|---|---|---|---|---|---|---|---|---|
| | PR>1.5 | | -2 | -2 | -2 | -2 | -2 | -2 | -2 | -2 |
| | 1.5 | 001.100 | -2 | -2 | -2 | -2 | -2 | -2 | -2 | -2 |
| | 1.375 | 001.011 | -2 | -2 | -2 | -2 | -2 | -2 | -2 | -2 |
| | 1.25 | 001.010 | -2 | -2 | -2 | -2 | -2 | -2 | -1 | -1 |
| | 1.125 | 001.001 | -2 | -2 | -2 | -2 | -2 | -1 | -1 | -1 |
| | 1 | 001.000 | -2 | -2 | -2 | -2 | -1 | -1 | -1 | -1 |
| | 0.875 | 000.111 | -2 | -2 | -1 | -1 | -1 | -1 | -1 | -1 |
| | 0.75 | 000.110 | -2 | -1 | -1 | -1 | -1 | -1 | -1 | -1 |
| | 0.625 | 000.101 | -1 | -1 | -1 | -1 | -1 | -1 | -1 | -1 |
| | 0.5 | 000.100 | -1 | -1 | -1 | -1 | -1 | -1 | -1 | -1 |
| | 0.375 | 000.011 | -1 | -1 | -1 | -1 | -1 | -1 | -1 | -1 |
| | 0.25 | 000.010 | -1 | -1 | -1 | -1 | 0 | 0 | 0 | 0 |
| | 0.125 | 000.001 | 0 | 0 | 0 | 0 | 0 | 0 | 0 | 0 |
| | 0 | 000.000 | 0 | 0 | 0 | 0 | 0 | 0 | 0 | 0 |
| | -0.125 | 111.111 | 0 | 0 | 0 | 0 | 0 | 0 | 0 | 0 |
| | 0.25 | 111.110 | 0 | 0 | 0 | 0 | 0 | 0 | 0 | 0 |
| | -0.375 | 111.101 | 1 | 1 | 0 | 0 | 0 | 0 | 0 | 0 |
| | -0.5 | 111.100 | 1 | 1 | 1 | 1 | 0 | 0 | 0 | 0 |
| | -0.625 | 111.011 | 1 | 1 | 1 | 1 | 1 | 1 | 1 | 1 |
| | 0.75 | 111.010 | 1 | 1 | 1 | 1 | 1 | 1 | 1 | 1 |
| | -0.875 | 111.001 | 2 1 | 1 | 1 | 1 | 1 | 1 | 1 | 1 |
| | -1 | 111.000 | 2 | 2 | 1 | 1 | 1 | 1 | 1 | 1 |
| | -1.125 | 110.111 | 2 | 2 | 2 | 1 | 1 | 1 | 1 | 1 |
| | -1.25 | 110.110 | 2 | 2 | 2 | 2 | 1 | 1 | 1 | 1 |
| | -1.375 | 110.101 | 2 | 2 | 2 | 2 | 2 | 2 | 1 | 1 |
| | -1.5 | 110.100 | 2 | 2 | 2 | 2 | 2 | 2 | 2 | 2 |
| | PR<-1.5 | | 2 | 2 | 2 | 2 | 2 | 2 | 2 | 2 |

DECIMAL BINARY (d) a first-stage multiplexer (1) having as data inputs the divisor D multiplied respectively by −2, −1, 0, +1, and +2, (2) having as a control input on said first cycle the output of said first selection logic, (3) having as a control input on said subsequent cycles the output of overlapping quotient bit selector logic, and (4) having as an output the said data input whose value is equal to the number defined by said two first-pair quotient bits multiplied by the divisor D;

(e) a first stage carry-save adder having (1) as inputs (i) the sum output and the carry output of the partial remainder register and (ii) the output of the first multiplexer, and (2) having as an output a first-stage partial remainder in said sum-and-carry form;

(f) said overlapping quotient bit selector logic (1) having as inputs (i) the five most significant bits of the divisor register and (ii) the output of the first-stage carry-save adder, and (2) having as an output two second-pair quotient bits, said two second-pair quotient bits defining one of the numbers −2, −1, 0, +1, and 30 2, the number so defined being determined by a FIG. 3 relationship among said inputs;

(g) a second multiplexer (1) having as data inputs the divisor D multiplied respectively by −2, −1, 0, +1, and 30 2, (2) having as a control input the output of said overlapping quotient bit selector logic, and (3) having as an output the said data input whose value is equal to the number defined by said two second-pair quotient bits multiplied by the divisor D;

(h) said second-stage carry-save adder (1) having as inputs the output of said first-stage carry-save adder and the output of said second multiplexer, and (2) having a sum output and a carry output that together comprise a second-stage partial remainder; and (i) a quotient assimilation adder (1) having as inputs (i) on said first cycle, the output of said first-stage selection logic, and (ii) on said subsequent cycles, the output of said overlapping quotient bit selector logic, and (2) having as an output a four-bit quotient group.

* * * * *

UNITED STATES PATENT AND TRADEMARK OFFICE
CERTIFICATE OF CORRECTION

PATENT NO. : 5,132,925  
DATED : July 21, 1992  
INVENTOR(S) : Theodore H. Kehl and David N. Cutler Page 1 of 2

It is certified that error appears in the above-identified patent and that said Letters Patent is hereby corrected as shown below:

Column 4, line 57, delete "<", and add -- $\leq$ --.

Column 8, line 34, delete "3 specification", and add -- 3 a specification --.

Column 13, line 21, delete " as imilator", and add -- assimilator --.

Column 13, line 34, delete "t)" and add, -- t1) --.

Column 16, line 24, delete "For example, those of ordinary skill having the benefit of this disclosure will of course recognize that the hardware-based discrete logic functions herein may alternatively and equivalently be implemented in software, i.e., through suitable programming of a processor system equipped with a suitable processor and a memory or other storage device. Such a software implementation would be a matter of routine for those of ordinary skill having the benefit of this disclosure and knowledge of the processor system in question."

Column 17, line 37, delete "2,(2)", and add -- +2,(2) --.

Column 19, line 62, delete "30 2," and add -- +2, --.

UNITED STATES PATENT AND TRADEMARK OFFICE
CERTIFICATE OF CORRECTION

PATENT NO. : 5,132,925

DATED : July 21, 1992

INVENTOR(S) : Theodore H. Kehl and David N. Cutler

It is certified that error appears in the above-identified patent and that said Letters Patent is hereby corrected as shown below:

Column 20, line 44, delete "30 2," and add -- +2, --.

Signed and Sealed this

Tenth Day of August, 1993

Attest:

MICHAEL K. KIRK

Attesting Officer

Acting Commissioner of Patents and Trademarks